United States Patent
Hiramatsu et al.

(10) Patent No.: US 12,519,450 B2
(45) Date of Patent: Jan. 6, 2026

(54) ACOUSTIC WAVE DEVICE WITH INTERDIGITAL TRANSDUCER ELECTRODE HAVING NON-ZERO TILT ANGLE

(71) Applicant: Skyworks Solutions, Inc., Irvine, CA (US)

(72) Inventors: Yuya Hiramatsu, Neyagawa (JP); Gong Bin Tang, Moriguchi (JP)

(73) Assignee: Skyworks Solutions, Inc., Irvine, CA (US)

( * ) Notice: Subject to any disclaimer, the term of this patent is extended or adjusted under 35 U.S.C. 154(b) by 112 days.

(21) Appl. No.: 18/069,420

(22) Filed: Dec. 21, 2022

(65) Prior Publication Data

US 2023/0208396 A1    Jun. 29, 2023

Related U.S. Application Data

(60) Provisional application No. 63/266,100, filed on Dec. 28, 2021, provisional application No. 63/266,098, filed on Dec. 28, 2021.

(51) Int. Cl.
*H03H 9/02* (2006.01)
*H03H 9/145* (2006.01)
(Continued)

(52) U.S. Cl.
CPC .... *H03H 9/02574* (2013.01); *H03H 9/02559* (2013.01); *H03H 9/14547* (2013.01);
(Continued)

(58) Field of Classification Search
CPC ............ H03H 9/25; H03H 9/64; H03H 9/643; H03H 9/542; H03H 9/14541;
(Continued)

(56) References Cited

U.S. PATENT DOCUMENTS

| 5,646,584 A | 7/1997 | Kondratyev et al. |
| 5,895,996 A | 4/1999 | Takagi et al. |

(Continued)

FOREIGN PATENT DOCUMENTS

| CN | 113098432 A | 7/2021 |
| FR | 3105894 A1 | 7/2021 |

(Continued)

OTHER PUBLICATIONS

Iwamoto et al., "Transverse Modes in I.H.P. SAW Resonator and Their Suppression Method", Murata Manufacturing co., Ltd., 4 pages (2018).

(Continued)

*Primary Examiner* — Lincoln D Donovan
*Assistant Examiner* — Tyler J Pereny
(74) *Attorney, Agent, or Firm* — Knobbe, Martens, Olson & Bear, LLP

(57) ABSTRACT

Acoustic wave device is disclosed. the acoustic wave device can include a piezoelectric layer and an interdigital transducer electrode over the piezoelectric layer. The interdigital transducer electrode having a non-zero tilt angle. The non-zero tilt angle can between 5° to 15°. The interdigital transducer electrode is configured to shift stopband of the acoustic wave device and to reduce a slanted stopband.

20 Claims, 12 Drawing Sheets

(51) Int. Cl.
*H03H 9/25* (2006.01)
*H03H 9/64* (2006.01)

(52) U.S. Cl.
CPC .......... *H03H 9/14558* (2013.01); *H03H 9/25* (2013.01); *H03H 9/643* (2013.01); *H03H 9/6483* (2013.01)

(58) Field of Classification Search
CPC ............. H03H 9/02574; H03H 9/6483; H03H 9/02559; H03H 9/02834; H03H 9/02992; H03H 9/145; H03H 9/6436; H03H 9/725; H03H 9/02685; H03H 9/1457; H03H 9/02692; H03H 9/02708; H03H 9/645; H03H 9/6463; H03H 9/6469; H03H 9/6476; H03H 9/6489; H03H 9/02858; H03H 9/02881; H03H 9/14547; H03H 3/10; H03H 9/02889; H03H 9/1452; H03H 9/14558; H03H 9/6406; H03H 9/02826; H03H 9/14594; H03H 9/14538
See application file for complete search history.

(56) References Cited

U.S. PATENT DOCUMENTS

| | | | |
|---|---|---|---|
| 7,230,512 B1 | 6/2007 | Carpenter et al. |
| 7,352,104 B2 | 4/2008 | Yamazaki et al. |
| 7,554,242 B2 | 6/2009 | Aoki et al. |
| 8,294,331 B2 | 10/2012 | Abbott et al. |
| 8,741,683 B2 | 6/2014 | Huang et al. |
| 9,065,424 B2 | 6/2015 | Nakanishi et al. |
| 9,124,240 B2 | 9/2015 | Shimizu et al. |
| 9,136,458 B2 | 9/2015 | Komatsu et al. |
| 9,257,960 B2 | 2/2016 | Ruile et al. |
| 9,413,330 B2 | 8/2016 | Shimizu et al. |
| 9,419,584 B2 | 8/2016 | Tsurunari et al. |
| 9,438,201 B2 | 9/2016 | Hori et al. |
| 9,537,464 B2 | 1/2017 | Yamanaka |
| 9,640,750 B2 | 5/2017 | Nakanishi et al. |
| 9,641,152 B2 | 5/2017 | Nakamura et al. |
| 9,673,779 B2 | 6/2017 | Ruile et al. |
| 9,748,923 B2 | 8/2017 | Kando et al. |
| 9,748,924 B2 | 8/2017 | Komatsu et al. |
| 10,090,825 B2 | 10/2018 | Kuroyanagi |
| 10,153,748 B2 | 12/2018 | Tanaka |
| 10,361,678 B2 | 7/2019 | Iwaki et al. |
| 10,476,470 B2 | 11/2019 | Takamine |
| 10,483,942 B2 | 11/2019 | Goto et al. |
| 10,574,207 B2 | 2/2020 | Yoon et al. |
| 10,727,844 B1 | 7/2020 | Gong et al. |
| 10,749,497 B2 | 8/2020 | Tang et al. |
| 10,826,507 B1 | 11/2020 | Gong et al. |
| 10,873,313 B2 | 12/2020 | Zou et al. |
| 11,050,406 B2 | 6/2021 | Maki et al. |
| 11,095,266 B2 | 8/2021 | Inoue et al. |
| 11,165,411 B2 | 11/2021 | Liu et al. |
| 11,239,817 B2 | 2/2022 | Hatano |
| 11,245,378 B2 | 2/2022 | Tang et al. |
| 11,296,672 B2 | 4/2022 | Hiratsuka et al. |
| 11,368,137 B2 | 6/2022 | Goto et al. |
| 11,522,514 B2 | 12/2022 | Zou et al. |
| 11,606,078 B2 | 3/2023 | Tang et al. |
| 11,616,491 B2 | 3/2023 | Tang et al. |
| 11,677,380 B2 | 6/2023 | Fujiwara et al. |
| 11,722,122 B2 | 8/2023 | Goto et al. |
| 11,750,172 B2 | 9/2023 | Goto et al. |
| 11,824,515 B2 | 11/2023 | Tang et al. |
| 11,962,283 B2 | 4/2024 | Zou et al. |
| 12,040,784 B2 | 7/2024 | Tang et al. |
| 12,047,053 B2 | 7/2024 | Maki et al. |
| 2004/0222717 A1 | 11/2004 | Matsuda et al. |
| 2005/0077982 A1 | 4/2005 | Funasaka |
| 2008/0018417 A1 | 1/2008 | Igaki et al. |
| 2010/0265010 A1 | 10/2010 | Jian |
| 2012/0049968 A1* | 3/2012 | Owaki | H03H 9/02834 331/158 |
| 2014/0285287 A1 | 9/2014 | Komatsu et al. |
| 2014/0339957 A1 | 11/2014 | Tajima et al. |
| 2016/0261038 A1 | 9/2016 | Tanaka |
| 2016/0294361 A1 | 10/2016 | Yamane et al. |
| 2017/0063332 A1 | 3/2017 | Gilbert et al. |
| 2017/0099043 A1 | 4/2017 | Goto et al. |
| 2017/0104470 A1 | 4/2017 | Koelle et al. |
| 2017/0214385 A1 | 7/2017 | Bhattacharjee |
| 2017/0214386 A1 | 7/2017 | Kido |
| 2017/0222618 A1 | 8/2017 | Inoue et al. |
| 2017/0250669 A1 | 8/2017 | Kuroyanagi et al. |
| 2017/0272051 A1 | 9/2017 | Kurihara et al. |
| 2017/0273183 A1 | 9/2017 | Kawasaki et al. |
| 2017/0288629 A1 | 10/2017 | Bhattacharjee et al. |
| 2017/0359048 A1 | 12/2017 | Yasuda |
| 2018/0013404 A1 | 1/2018 | Kawasaki et al. |
| 2018/0048290 A1 | 2/2018 | Sekine et al. |
| 2018/0097501 A1 | 4/2018 | Kikuchi et al. |
| 2018/0097508 A1 | 4/2018 | Iwamoto et al. |
| 2018/0102755 A1* | 4/2018 | Takamine | H03H 9/6483 |
| 2018/0138893 A1 | 5/2018 | Caron |
| 2018/0316329 A1 | 11/2018 | Guenard et al. |
| 2018/0367119 A1 | 12/2018 | Lee |
| 2019/0288661 A1 | 9/2019 | Akiyama et al. |
| 2019/0319772 A1 | 10/2019 | Ando et al. |
| 2019/0379347 A1 | 12/2019 | Goto et al. |
| 2020/0036362 A1* | 1/2020 | Daimon | H03H 9/706 |
| 2020/0067482 A1 | 2/2020 | Maki et al. |
| 2020/0106420 A1 | 4/2020 | Kodama et al. |
| 2020/0144984 A1 | 5/2020 | Fukuhara et al. |
| 2020/0212875 A1 | 7/2020 | Goto et al. |
| 2020/0212883 A1 | 7/2020 | Goto et al. |
| 2020/0220522 A1* | 7/2020 | Nosaka | H03H 9/605 |
| 2020/0358424 A1 | 11/2020 | Kaneda et al. |
| 2020/0366268 A1 | 11/2020 | Goto et al. |
| 2020/0366270 A1 | 11/2020 | Matsuoka |
| 2020/0389151 A1 | 12/2020 | Goto |
| 2021/0126616 A1 | 4/2021 | Hiramatsu et al. |
| 2021/0159886 A1* | 5/2021 | Goto | H03H 9/25 |
| 2021/0167748 A1 | 6/2021 | Huck et al. |
| 2021/0297060 A1* | 9/2021 | Omura | H03H 9/564 |
| 2022/0014152 A1 | 1/2022 | Gebeyehu et al. |
| 2022/0014175 A1 | 1/2022 | Nagatomo et al. |
| 2022/0077840 A1 | 3/2022 | Caron |
| 2022/0109419 A1 | 4/2022 | Esquius Morote |
| 2022/0209738 A1 | 6/2022 | Torazawa et al. |
| 2022/0271730 A1 | 8/2022 | Abbott et al. |
| 2022/0271733 A1 | 8/2022 | Abbott et al. |
| 2022/0271734 A1 | 8/2022 | Abbott et al. |
| 2022/0328980 A1 | 10/2022 | Dicarlo et al. |
| 2022/0360249 A1 | 11/2022 | Ballandras et al. |
| 2022/0399867 A1 | 12/2022 | Goto et al. |
| 2022/0399871 A1 | 12/2022 | Goto et al. |
| 2023/0013597 A1 | 1/2023 | Goto et al. |
| 2023/0016884 A1 | 1/2023 | Goto et al. |
| 2023/0026465 A1 | 1/2023 | Huang et al. |
| 2023/0031568 A1 | 2/2023 | Tang et al. |
| 2023/0032325 A1 | 2/2023 | Goto et al. |
| 2023/0039507 A1 | 2/2023 | Kim et al. |
| 2023/0104405 A1 | 4/2023 | Hiramatsu et al. |
| 2023/0105726 A1 | 4/2023 | Tang et al. |
| 2023/0107376 A1 | 4/2023 | Goto et al. |
| 2023/0109106 A1 | 4/2023 | Hiramatsu et al. |
| 2023/0112677 A1 | 4/2023 | Tang et al. |
| 2023/0163748 A1 | 5/2023 | Goto et al. |
| 2023/0208385 A1 | 6/2023 | Hiramatsu et al. |
| 2023/0208398 A1 | 6/2023 | Goto et al. |
| 2023/0208399 A1 | 6/2023 | Goto et al. |
| 2023/0223910 A1 | 7/2023 | Goto et al. |
| 2023/0223917 A1 | 7/2023 | Goto et al. |
| 2023/0231529 A1 | 7/2023 | Hiramatsu et al. |
| 2023/0275565 A1 | 8/2023 | Tang et al. |
| 2023/0283261 A1 | 9/2023 | Huang et al. |
| 2023/0327630 A1 | 10/2023 | Goto et al. |
| 2023/0327642 A1 | 10/2023 | Goto et al. |
| 2023/0327645 A1 | 10/2023 | Goto et al. |
| 2023/0336152 A1 | 10/2023 | Goto et al. |

(56) References Cited

U.S. PATENT DOCUMENTS

| | | |
|---|---|---|
| 2023/0336153 A1 | 10/2023 | Goto et al. |
| 2023/0336159 A1 | 10/2023 | Hiramatsu et al. |
| 2023/0344411 A1 | 10/2023 | Chen et al. |
| 2023/0344415 A1 | 10/2023 | Chen et al. |
| 2023/0344416 A1 | 10/2023 | Chen et al. |
| 2024/0022164 A1 | 1/2024 | Gong et al. |
| 2024/0039507 A1 | 2/2024 | Goto et al. |
| 2024/0186978 A1 | 6/2024 | Hiramatsu et al. |
| 2024/0223149 A1 | 7/2024 | Goto et al. |
| 2024/0223152 A1 | 7/2024 | Goto et al. |
| 2024/0223156 A1 | 7/2024 | Goto et al. |
| 2024/0364305 A1 | 10/2024 | Goto |

FOREIGN PATENT DOCUMENTS

| | | |
|---|---|---|
| JP | 2009-219045 A | 9/2009 |
| JP | 2014-135624 A | 7/2014 |
| JP | 2020-092422 A | 6/2020 |
| WO | 2017/161303 A1 | 9/2017 |

OTHER PUBLICATIONS

Kapp, M., et al., "Investigation of GeO2 thin film properties for improvement of temperature coefficient of frequency of SAW devices", 2014 European Frequency and Time Forum (EFTF), Jun. 2014, 4 pages.

Solal et al., "A method to reduce losses in buried electrodes RF SAW resonators," 2011 IEEE International Ultrasonics Symposium, 2011, pp. 324-332, doi: 10.1109/ULTSYM.2011.0078.

U.S. Appl. No. 18/069,414 Published As 2023/0208385 A1, filed Dec. 21, 2022, Acoustic Wave Device With Tilted Interdigital Transducer Electrode.

U.S. Appl. No. 18/069,420 Published as 2023/0208396 A1, filed Dec. 21, 2022, Acoustic Wave Device With Interdigial Transducer Electrode Having Non-Zero Tilt Angle.

\* cited by examiner

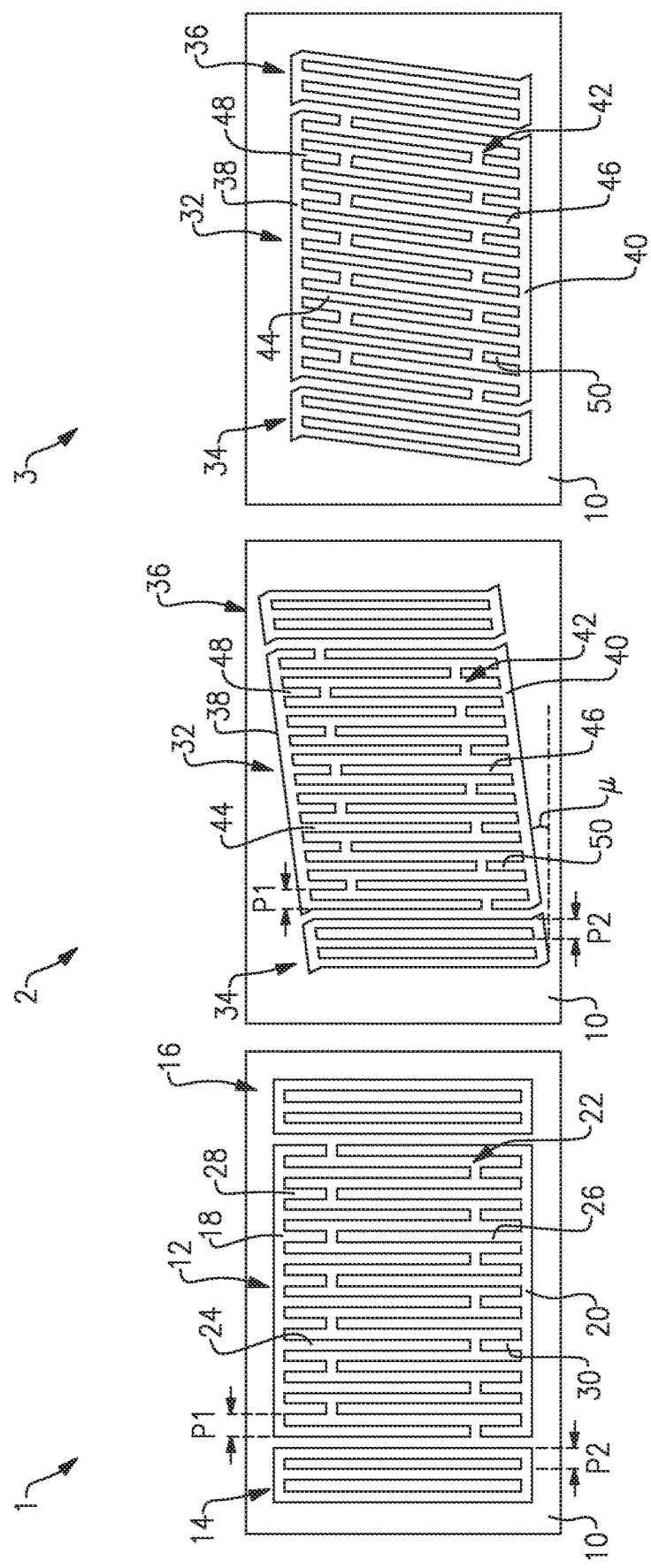

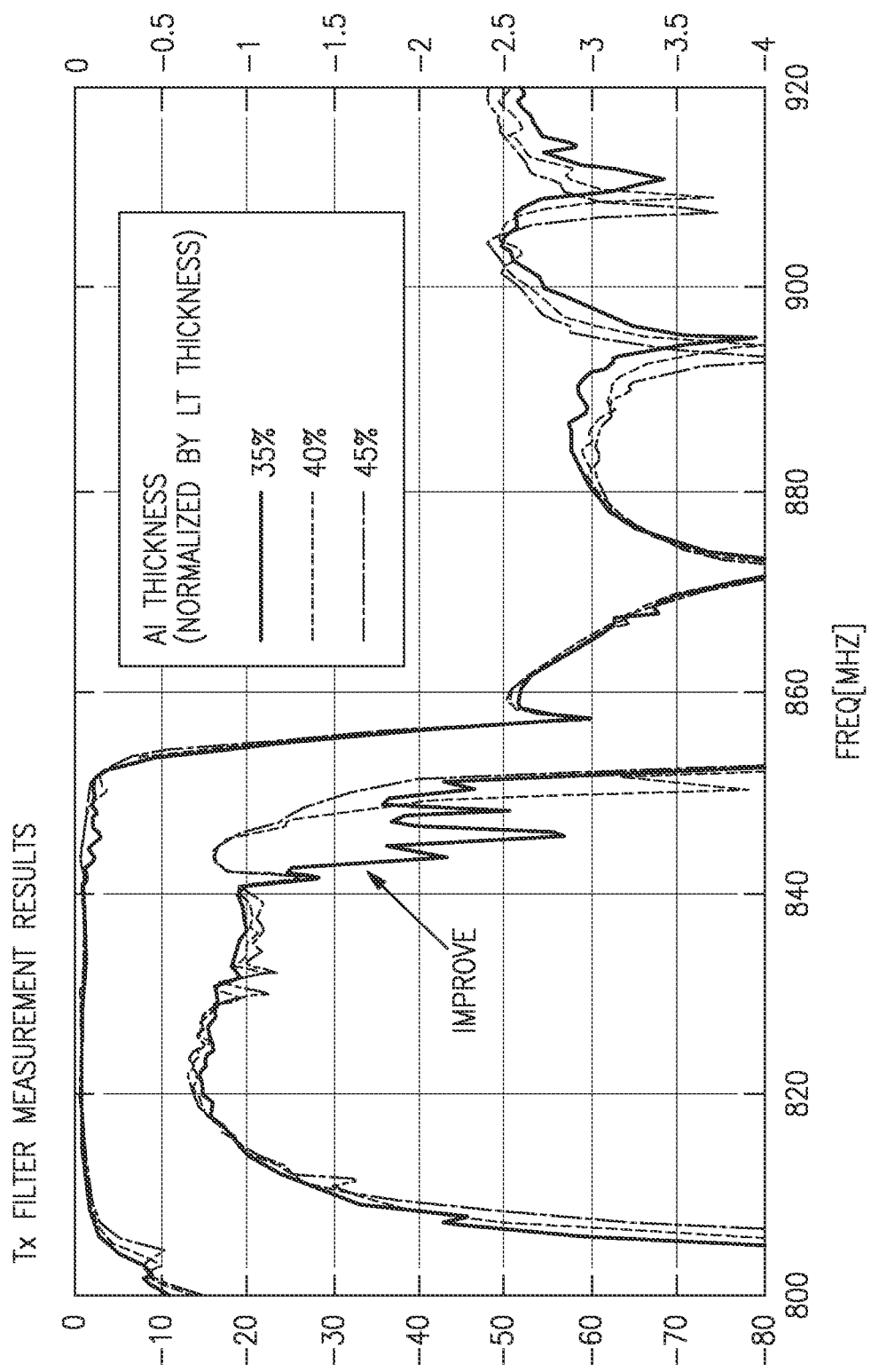

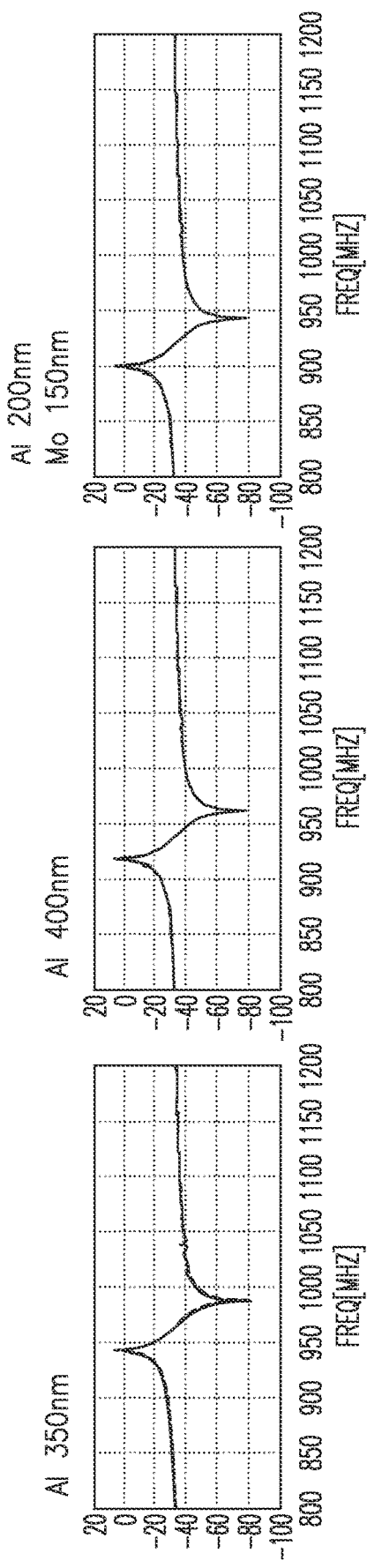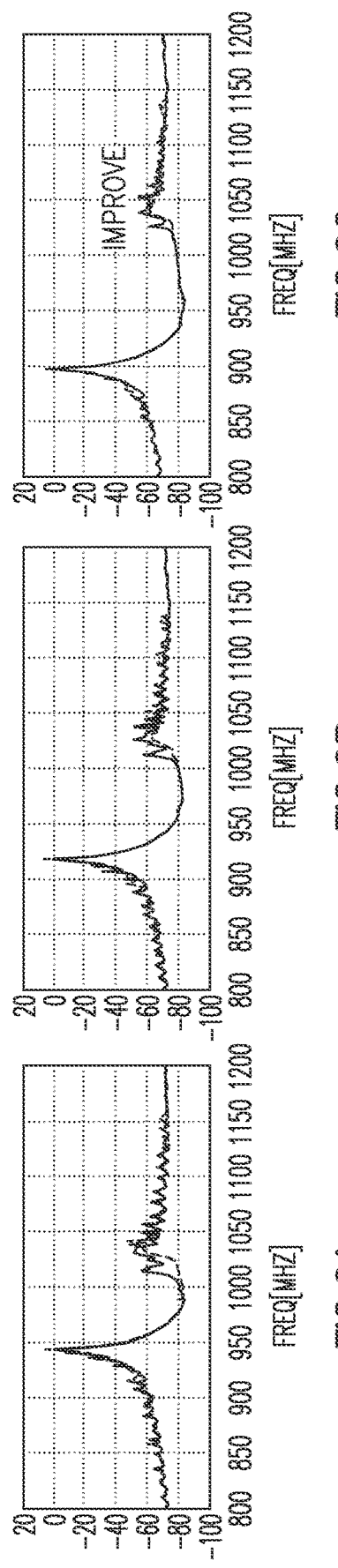
FIG. 9A  FIG. 9B  FIG. 9C

ACOUSTIC WAVE DEVICE WITH INTERDIGITAL TRANSDUCER ELECTRODE HAVING NON-ZERO TILT ANGLE

CROSS REFERENCE TO PRIORITY APPLICATION

This application claims the benefit of priority of U.S. Provisional Patent Application No. 63/266,100, filed Dec. 28, 2021 and titled "ACOUSTIC WAVE DEVICE WITH TILTED INTERDIGITAL TRANSDUCER ELECTRODE," and U.S. Provisional Patent Application No. 63/266,098, filed Dec. 28, 2021 and titled "ACOUSTIC WAVE DEVICE WITH INTERDIGITAL TRANSDUCER ELECTRODE HAVING NON-ZERO TILT ANGLE," the disclosures of which are hereby incorporated by reference in their entirety herein.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY

In one aspect, an acoustic wave device configured to generate a surface acoustic wave having a wavelength $\lambda$ is disclosed. The acoustic wave device can include a piezoelectric layer, a first reflector on the piezoelectric layer, a second reflector on the piezoelectric layer, and an interdigital transducer electrode over the piezoelectric layer and positioned between the first reflector and the second reflector. The interdigital transducer electrode has a tilt angle. The tilt angle is between 5° to 15°. A thickness of the interdigital transducer electrode is at least 0.08$\lambda$.

In one embodiment, the interdigital transducer electrode has a pitch that is wider than a pitch of the first reflector so as to shift stopband of the acoustic wave device.

In one embodiment, the interdigital transducer electrode includes an aluminum layer. The thickness of the interdigital transducer electrode can be at least 0.09$\lambda$.

In one aspect, an acoustic wave device is disclosed. The acoustic wave device can include a lithium tantalate piezoelectric layer, and a single layer aluminum interdigital transducer electrode over the piezoelectric layer. The interdigital transducer electrode has a tilt angle. The tilt angle is between 5° to 15°. A thickness of the interdigital transducer electrode is at least 400 nm.

In one embodiment, the acoustic wave device further includes a first reflector and a second reflector that are positioned such that the interdigital transducer electrode is disposed between the first reflector and the second reflector. The interdigital transducer electrode can have a pitch that is wider than a pitch of the first reflector so as to shift stopband of the acoustic wave device.

In one aspect, an acoustic wave device is disclosed. The acoustic wave device can include a piezoelectric layer and an interdigital transducer electrode over the piezoelectric layer. The interdigital transducer electrode has a tilt angle. The tilt angle is non-zero. A thickness of the interdigital transducer electrode is at least 40% of a thickness of the piezoelectric layer.

In one embodiment, the interdigital transducer electrode includes an aluminum layer. The interdigital transducer electrode can be a single aluminum layer. The interdigital transducer electrode can be a multilayer interdigital transducer electrode that includes the aluminum layer and a titanium layer.

In one embodiment, the thickness of the interdigital transducer electrode can be at least 45% of the thickness of the piezoelectric layer.

In one embodiment, the thickness of the interdigital transducer electrode is at least 400 nm.

In one embodiment, the acoustic wave device is configured to generate a surface acoustic wave having a wavelength $\lambda$, the thickness of the interdigital transducer electrode is at least 0.08$\lambda$.

In one embodiment, the tilt angle is between 5° to 15°.

In one embodiment, he acoustic wave device further includes a first reflector and a second reflector positioned such that the interdigital transducer electrode is disposed between the first reflector and the second reflector. The interdigital transducer electrode can have a pitch that is wider than a pitch of the first reflector so as to shift stopband of the acoustic wave device.

In one embodiment, the piezoelectric layer is a lithium tantalate layer.

In one embodiment, the acoustic wave device further includes a support substrate positioned under the piezoelectric layer. The acoustic wave device can further include an intermediate layer between the piezoelectric layer and the support substrate. The support substrate can include silicon and the intermediate layer can include silicon dioxide.

In one aspect, an acoustic wave device is disclosed. The acoustic wave device can include a piezoelectric layer and an interdigital transducer electrode over the piezoelectric layer. The interdigital transducer electrode has a non-zero tilt angle. The interdigital transducer electrode is configured to shift a stopband of the acoustic wave device and to reduce a slanted stopband.

In one embodiment, a total weight of the interdigital transducer electrode is selected so as to reduce the slanted stopband of the acoustic wave device.

In one embodiment, the interdigital transducer electrode includes an aluminum layer. The interdigital transducer electrode can be a single aluminum layer. The interdigital transducer electrode can be a multilayer interdigital transducer electrode that includes the aluminum layer and a titanium layer.

In one embodiment, a thickness of the interdigital transducer electrode is at least 40% of a thickness of the piezoelectric layer.

In one embodiment, a thickness of the interdigital transducer electrode is at least 400 nm.

In one embodiment, the acoustic wave device is configured to generate a surface acoustic wave having a wavelength λ, a thickness of the interdigital transducer electrode is at least 0.082. The thickness of the interdigital transducer electrode can be at least 0.092.

In one embodiment, the tilt angle is between 5° to 15°.

In one embodiment, the acoustic wave device further includes a first reflector and a second reflector that are positioned such that the interdigital transducer electrode is disposed between the first reflector and the second reflector. The interdigital transducer electrode can have a pitch that is wider than a pitch of the first reflector so as to shift stopband of the acoustic wave device to a higher frequency as compared to when the pitch of the interdigital transducer electrode is equal to the pitch of the first reflector.

In one embodiment, the piezoelectric layer is a lithium tantalate layer.

In one embodiment, the acoustic wave device further includes a support substrate positioned under the piezoelectric layer. The acoustic wave device can further include an intermediate layer between the piezoelectric layer and the support substrate. The support substrate can include silicon and the intermediate layer can include silicon dioxide.

In one aspect, an acoustic wave device is disclosed. The acoustic wave device can include a piezoelectric layer, a first reflector on the piezoelectric layer, a second reflector on the piezoelectric layer, and an interdigital transducer electrode over the piezoelectric layer and positioned between the first reflector and the second reflector. The interdigital transducer electrode has a tilt angle. The tilt angle is between 5° to 15°. A pitch of the interdigital transducer electrode is different from a pitch of the first reflector to shift a stopband of the acoustic wave device. A thickness of the interdigital transducer electrode is configured to reduce a slanted stopband.

In one embodiment, the pitch of the interdigital transducer electrode is wider than the pitch of the first reflector.

In one embodiment, the interdigital transducer electrode includes an aluminum layer.

In one embodiment, the acoustic wave device is configured to generate a surface acoustic wave having a wavelength λ, and a thickness of the interdigital transducer electrode is at least 0.08λ.

In one embodiment, the piezoelectric layer is a lithium tantalate layer.

The present disclosure relates to U.S. patent application Ser. No. 18/069,414, titled "ACOUSTIC WAVE DEVICE WITH TILTED INTERDIGITAL TRANSDUCER ELECTRODE," filed on even date herewith filed on even date herewith, the entire disclosure of which are hereby incorporated by reference herein.

BRIEF DESCRIPTION OF THE DRAWINGS

Embodiments of this disclosure will now be described, by way of non-limiting example, with reference to the accompanying drawings.

FIG. 1 shows a top layout view of a SAW resonator.

FIG. 2 shows a top layout view of another SAW resonator.

FIG. 3 shows a top layout view of another SAW resonator.

FIG. 7 is a graph showing measurement results of the SAW resonator of FIGS. 6A and 6B used as a transmitter (Tx) filter.

FIGS. 9A to 9C are graphs showing frequency response measurement results of SAW resonators that are similar to the SAW resonator 4 illustrated in FIGS. 6A and 6B.

DETAILED DESCRIPTION OF CERTAIN EMBODIMENTS

Figure 4:
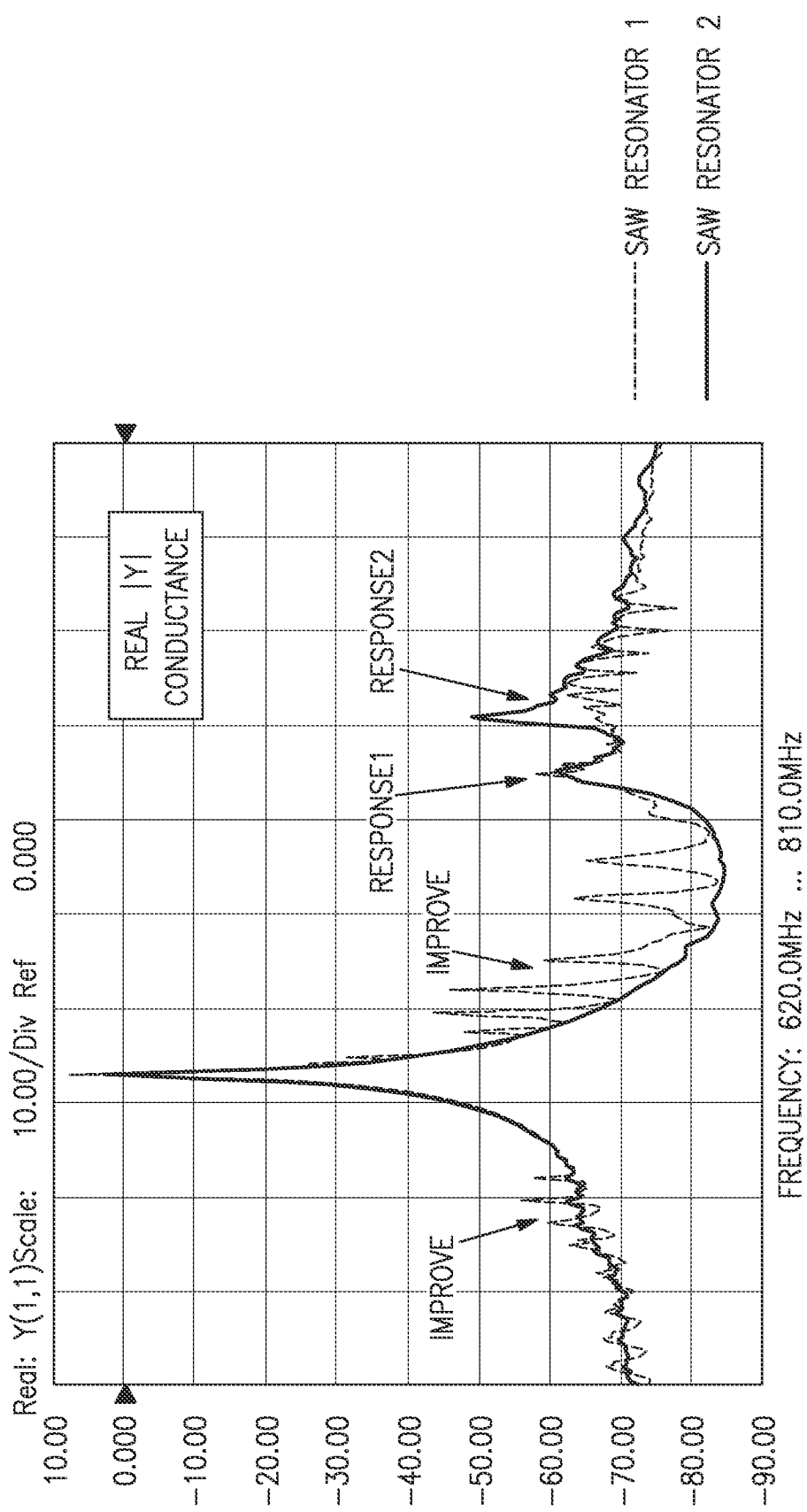
FIG. 4 is a graph showing measurement results of admittance of a SAW resonator similar to the SAW resonator illustrated in FIG. 1, and a SAW resonator similar to the SAW resonator 2 illustrated in FIG. 2.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, ladder filters, and multi-mode SAW (MMS) filters (e.g., double mode SAW (DMS) filters). A SAW resonator can be configured to generate, for example, a Rayleigh mode surface acoustic wave or a shear horizontal mode surface acoustic wave. Although embodiments may be discussed with reference to SAW resonators, any suitable principles and advantages disclosed herein can be implemented in any suitable SAW devices.

In general, high quality factor (Q), large effective electromechanical coupling coefficient ($k^2$), high frequency ability, and spurious free response can be significant aspects for micro resonators to enable low-loss filters, stable oscillators, and sensitive sensors.

SAW resonators can include a multilayer piezoelectric substrate. Multi-layer piezoelectric substrates can provide good thermal dissipation characteristics and improved temperature coefficient of frequency (TCF) relative to certain single layer piezoelectric substrates. For example, certain SAW resonators with a piezoelectric layer on a high impedance layer, such as silicon, can achieve a better temperature coefficient of frequency (TCF) and thermal dissipation compared to similar devices without the high impedance layer. A better TCF can contribute to obtaining the large effective electromechanical coupling coefficient ($k^2$). Various embodiments of SAW devices disclosed herein can have a multilayer piezoelectric substrate (MPS) structure.

SAW resonators can have a relatively strong transverse mode in and/or near a pass band. The presence of the relatively strong transverse modes can hinder the accuracy and/or stability of oscillators and sensors, as well as hurt the performance of acoustic wave filters by creating relatively severe passband ripples and possibly limiting the rejection. Therefore, transverse mode suppression can be significant for SAW resonators.

Tilted interdigital transducer (IDT) electrodes can be used to suppress spurious responses (e.g., a transverse mode spurious) in multi-layer piezoelectric substrate (MPS) SAW resonators. However, the tilted IDT can create an unwanted noise caused by a transverse bus bar reflection which can be observed as a slanted stopband in a frequency response. This disclosure provides a technical solution to suppressing transverse modes of MPS SAW resonators using a tilted IDT and an increased IDT thickness or mass (e.g., a total weight of the IDT electrode structure). The combination of the tilted IDT and increased IDT thickness or mass can improve frequency response relative to tilt angle alone. Various embodiments disclosed herein can also utilize pitch modulation to shift stopband of resonator to outside of a frequency range of interest.

Embodiments of SAW resonators disclosed herein include an interdigital transducer (IDT) electrode that has a rotation angle and a tilt angle. The rotation angle refers to a third Euler angle ψ of Euler angles (φ, θ, ψ) of the crystal orientation of a carrier or substrate (e.g., a piezoelectric layer). An IDT electrode includes bus bars and fingers extending from the bus bars. A SAW resonator with the rotation angle (ψ) of 0° and the tilt angle (μ) of 0° has a horizontal reference axis that is in parallel with a wave propagation direction of the SAW resonator (e.g., a crystal reference). The SAW resonator also has a vertical reference axis that is in parallel with a longitudinal direction of a finger of the IDT electrode when the SAW resonator has a rotation angle (ψ) of 0° and the tilt angle (μ) of 0°. Therefore, the rotation angle (ψ) can also refer to an angle of the entire IDT electrode structure (the fingers and the bus bar) relative to the horizontal reference axis of the SAW resonator. The tilt angle (μ) refers to an angle of the bus bar relative to the horizontal reference axis of wave propagation in the SAW resonator while the fingers of the IDT electrode are parallel to the vertical reference axis.

In a final product, first and second sides of a chip that includes a SAW resonator with the rotation angle (ψ) of 0° and the tilt angle (μ) of 0° can extend parallel with a bus bar of the SAW resonator, and third and fourth sides of the chip that extends perpendicular to the first and second sides can extend parallel with fingers of the SAW resonator. In a final product, first and second sides of a chip that includes a SAW resonator with the rotation angle (ψ) of 0° and the tilt angle (μ) of non-zero can extend non-parallel with a bus bar of the SAW resonator, and third and fourth sides of the chip that extends perpendicular to the first and second sides can extend parallel with fingers of the SAW resonator. In a final product, first and second sides of a chip that includes a SAW resonator with the rotation angle (ψ) of x° (x being non-zero) and the tilt angle (μ) of –x° can extend parallel with a bus bar of the SAW resonator, and third and fourth sides of the chip that extends perpendicular to the first and second sides can extend non-parallel with fingers of the SAW resonator.

FIG. 1 shows a top layout view of a SAW resonator 1. The SAW resonator 1 includes a piezoelectric layer 10, and an IDT electrode 12 and a pair of reflectors 14, 16 over the piezoelectric layer 10. The IDT electrode 12 of the SAW resonator 1 includes a first bus bar 18, a second bus bar 20, and a finger region 22 between the first bus bar 18 and the second bus bar 20.

The finger region 22 includes first fingers 24 that extend from the first bus bar 18 and second fingers 26 that extend from the second bus bar 20. The finger region 22 includes first dummy fingers 28 that extend from the first bus bar 18 and second dummy fingers 30 that extend from the second bus bar 20. The first and second dummy fingers 28, 30 are shorter than the first and second fingers 24, 26. The first and second dummy fingers 28, 30 can function as pseudo-electrodes for preventing or mitigating interference with the propagation of a wave generated by the first and second fingers 24, 26. The IDT electrode 12 has a first pitch P1 (an IDT pitch) and the reflectors 14, 16 have a second pitch P2 (a reflector pitch).

The first bus bar 18 and the second bus bar 20 extend in parallel along a horizontal axis x. The first fingers 24 and the second fingers 26 extend along a vertical axis y that is perpendicular to the horizontal axis x. A third Euler angle ψ of Euler angles (φ, θ, ψ) of the crystal orientation of piezoelectric layer 10 is set to 0°. Therefore, the illustrated IDT electrode 12 of the SAW resonator 1 has a rotation angle r relative of 0° and a tilt angle μ relative to the horizontal axis x of 0°.

FIG. 2 shows a top layout view of a SAW resonator 2. FIGS. 1 and 2 are illustrated along the same horizontal axis and with parallel vertical axes. The SAW resonator 2 includes a piezoelectric layer 10, and an IDT electrode 32 and a pair of reflector structures 34, 36 over the piezoelectric layer 10. The IDT electrode 32 of the SAW resonator 2 includes a first bus bar 38, a second bus bar 40, and a finger region 42.

The finger region 42 includes first fingers 44 that extend from the first bus bar 38 and second fingers 46 that extend from the second bus bar 40. The finger region 42 includes first dummy fingers 48 that extend from the first bus bar 38. The finger region 42 also includes second dummy fingers 50 that extend from the second bus bar 40. The IDT electrode 32 has a first pitch P1 (an IDT pitch) and the reflector structures 34, 36 have a second pitch P2 (a reflector pitch).

The IDT electrode 32 of the SAW resonator 2 is tilted relative to the IDT electrode 12 of the SAW resonator 1. The IDT electrode 32 of the SAW resonator 2 has a tilt angle μ.

The illustrated IDT electrode 32 has the tilt angle μ of non-zero. The first fingers 44 and the second fingers 46 extend along the vertical axis y. A third Euler angle ψ of Euler angles (φ, θ, ψ) of the crystal orientation of piezoelectric layer 10 is set to 0°. Therefore, the illustrated IDT electrode 32 of the SAW resonator 2 has a rotation angle r of 0° and the tilt angle μ of non-zero. In some embodiments, the tilt angle μ can be about 8°. For example, the tilt angle μ can be between 5° to 15°. The IDT electrode 32 of the SAW resonator 2 is oriented on the piezoelectric layer 10 such that the acoustic propagation direction is along the horizontal axis x.

FIG. 3 shows a top layout view of a SAW resonator 3. FIGS. 1 to 3 are illustrated along the same horizontal axis and with parallel vertical axes. The SAW resonator 3 includes a piezoelectric layer 10, and an IDT electrode 32 and a pair of reflector structures 34, 36 over the piezoelectric layer 10. The IDT electrode 32 of the SAW resonator 3 includes a first bus bar 38, a second bus bar 40, and a finger region 42. The SAW resonator 3 is generally similar to the SAW resonator 2 except that the IDT electrode 32 of the SAW resonator 3 is oriented on the piezoelectric layer 10 such that the first bus bar 38 and the second bus bar 40 extend along the horizontal axis x, and the fingers 44, 46 extends non-parallel with the vertical axis y. Therefore, the illustrated IDT electrode 32 of the SAW resonator 3 has a rotation angle r of non-zero and the tilt angle μ of non-zero. The orientation of the IDT electrode 32 and the pair of reflector structures 34, 36 of the SAW resonator 3 helps reduce an area on the piezoelectric layer 10 needed for the IDT electrode 32 and the pair of reflector structures 34, 36. The IDT electrode 32 of the SAW resonator 3 is oriented on the piezoelectric layer 10 such that the acoustic propagation direction is angled by the tilt angle μ relative to the horizontal axis x.

FIG. 4 is a graph showing measurement results of admittance of a SAW resonator similar to the SAW resonator 1 illustrated in FIG. 1, and a SAW resonator similar to the SAW resonator 2 illustrated in FIG. 2. The measurement results indicate that some spurious responses (e.g., a transverse mode spurious) in the admittance of the SAW resonator 2 is suppressed as compared to the admittance of the SAW resonator 1. The measurement results also show a stopband (response 1) of the SAW resonator 1 and the SAW resonator 2 at a frequency that may degrade the filter characteristics. The measurement results further show that the SAW resonator 2 introduces an unwanted response (response 2). The response 2 observed in the measurement result can be caused by a transverse bus bar reflection which can be observed as a slanted stopband in a frequency response. More specifically, since the first and second fingers 44, 46 of the IDT electrode 32 are not perpendicular to the first and second bus bars 38, 40 respectively, portions of the first and second bus bars 38, 40 can be in the acoustic wave propagation direction of the IDT electrode 32. Thus, the transverse bus bar reflection may be observed as the response 2 or the slanted stopband.

Figure 5:
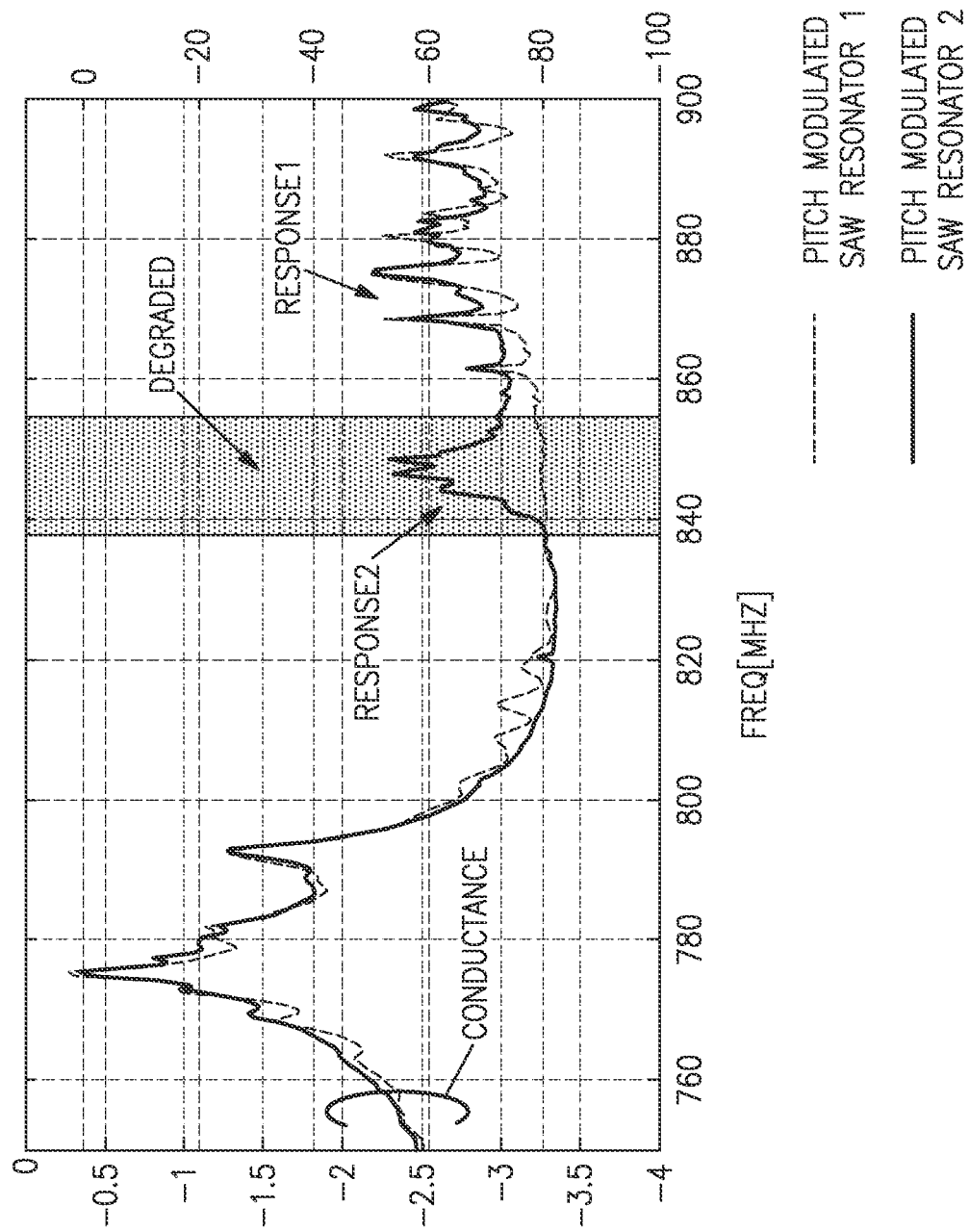
FIG. 5 is a graph showing measurement results of admittance of pitch modulated SAW resonators.

FIG. 5 is a graph showing measurement results of admittance of a SAW resonator similar to the SAW resonator 1 illustrated in FIG. 1, and a SAW resonator similar to the SAW resonator 2 illustrated in FIG. 2. The SAW resonators used in the measurements in FIG. 5 are different from the SAW resonators used in the measurements in FIG. 4 in that the SAW resonators used in the measurements in FIG. 5 have the second pitch P2 (the IDT pitch) greater than the first pitch P1 (the reflector pitch). The measurement results of FIG. 5 indicate that pitch modulation can shift the stopband (response 1). By increasing the second pitch P2 relative to the first pitch P1, the response 1 can be shifted to a higher frequency. Accordingly, FIG. 5 indicates that pitch modulation can be utilized to improve the frequency response by shifting the response 1. However, the unwanted response 2 remains in the frequency of interest at around 850 MHz for the pitch modulated SAW resonator 2. In various embodiments disclosed herein, the first pitch P1 and the second pitch P2 can be modulated such that the first pitch P1 is within 10% of the second pitch P2.

Figure 6A:
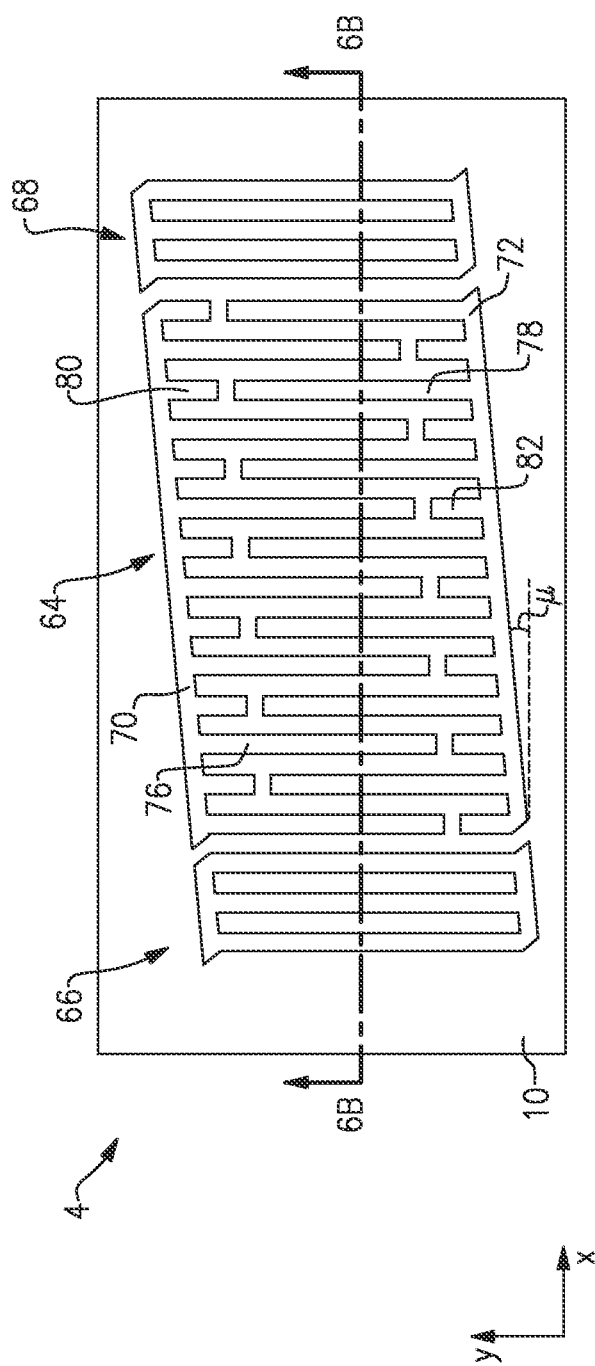
FIG. 6A shows a top layout view of a SAW resonator according to an embodiment.
Figure 6B:
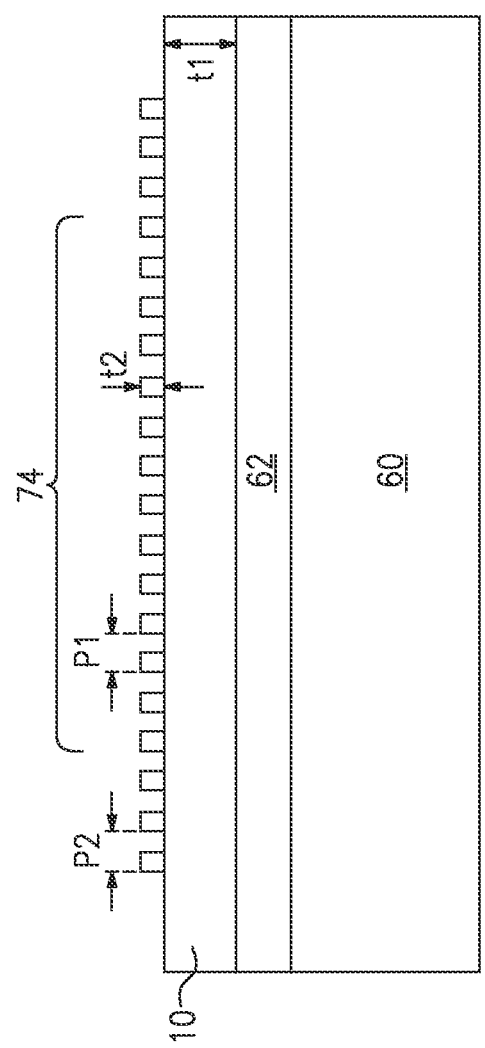
FIG. 6B is a schematic cross sectional side view of the SAW resonator of FIG. 6A.

FIG. 6A shows a top layout view of a SAW resonator 4 according to an embodiment. FIG. 6B is a schematic cross sectional side view of the SAW resonator 4 of FIG. 6A. The SAW resonator 4 can include a support substrate 60, a piezoelectric layer 10 over the support substrate 60, an intermediate layer 62 between the support substrate 60 and the piezoelectric layer 10, and an IDT electrode 64 and a pair of reflectors 66, 68 over the piezoelectric layer 10. The IDT electrode 64 of the SAW resonator 4 can include a first bus bar 70, a second bus bar 72, and a finger region 74 between the first and second bus bars 70, 72.

The finger region 74 includes first fingers 76 that extend from the first bus bar 70 and second fingers 78 that extend from the second bus bar 72. The finger region 74 includes first dummy fingers 80 that extend from the first bus bar 70. The finger region 74 also includes second dummy fingers 82 that extend from the second bus bar 72. The IDT electrode 64 has a first pitch P1 (an IDT pitch) and the reflectors 66, 68 have a second pitch P2 (a reflector pitch). In some embodiments, the first pitch P1 and the second pitch P2 can be different. For example, the first pitch P1 and the second pitch P2 can be modulated to shift a stop band of the SAW resonator 4. The first pitch P1 of the IDT electrode can set the wavelength λ of the SAW resonator 4. The first pitch P1 is typically equal to the wavelength λ.

The IDT electrode 64 of the SAW resonator 4 is tilted relative to the IDT electrode 12 of the SAW resonator 1. The IDT electrode 64 of the SAW resonator 4 has a tilt angle μ. The illustrated IDT electrode 64 has the tilt angle μ of non-zero. The first fingers 76 and the second fingers 78 extend along the vertical axis y. Therefore, the illustrated IDT electrode 64 of the SAW resonator 4 has a rotation angle r of 0° and the tilt angle μ of non-zero. In some embodiments, the tilt angle μ can be about 8°. For example, the tilt angle μ can be between 5° to 15°. The IDT electrode 64 of the SAW resonator 4 is oriented on the piezoelectric layer 10 such that the acoustic propagation direction is along the horizontal axis X.

The piezoelectric layer 10 can be a lithium tantalate (LT) layer. For example, the piezoelectric layer 10 can be an LT layer having a cut angle of 42° (42°Y-cut X-propagation LT). For example, the piezoelectric layer 10 can be 42±15° Y-cut LT, 42±10° Y-cut LT, or 42±5° Y-cut LT. Any other suitable piezoelectric material, such as a lithium niobate (LN) layer, can be used as the piezoelectric layer 10.

The support substrate 60 can be a silicon substrate, a quartz substrate, a sapphire substrate, a polycrystalline spinel substrate, a ceramic substrate, or any other suitable carrier substrate. In some embodiments, the intermediate layer 62 can act as an adhesive layer. The intermediate layer 62 can include any suitable material. The intermediate layer 62 can be, for example, an oxide layer (e.g., a silicon dioxide ($SiO_2$) layer).

The piezoelectric layer 10 has a thickness t1 and the IDT electrode 64 has a thickness t2. In some embodiments, the thickness t2 of the IDT electrode 64 can be more than about 40% of the thickness t1 of the piezoelectric layer 10. For example, the thickness t2 of the IDT electrode 64 can be more than 40%, 54%, or 50% of the thickness t1 of the piezoelectric layer 10. In some embodiments, the thickness t2 of the IDT electrode 64 can be in a range of 350 nm to 450 nm, 350 nm to 400 nm, or 400 nm to 450 nm. In some embodiments, the thickness t2 of the IDT electrode 64 can be in a range from 7% to 10% of the wavelength λ of the SAW resonator 4. For example, the thickness t2 of the IDT electrode 64 can be between 7.35% to 9.45%, 7.35% to 8.4%, or 8.4% to 9.45% of the wavelength λ of the SAW resonator 4. For example, the thickness t2 of the IDT electrode 64 can be at least 8%, 9%, or 10% of the wavelength λ of the SAW resonator 4. In some embodiments, the thickness t2 of the IDT electrode 64 can be about 450 nm while the wavelength 2 of the SAW resonator 4 is set to about 5.68 µm.

FIG. 7 is a graph showing measurement results of the SAW resonator 4 used as a transmitter (Tx) filter. In the measurements, three different thicknesses of the IDT electrodes were used. The SAW resonator 4 used in the measurements includes an LT layer for the piezoelectric layer 10, a silicon layer for the support substrate 60, a silicon dioxide (SiO$_2$) layer for the intermediate layer 62, and an aluminum layer for the IDT electrode 64. The wavelength 2 of the SAW resonator 4 is set to 4.76 µm.

One measurement was taken setting the thickness t2 of the IDT electrode 64 to be 35% of the thickness t1 of the piezoelectric layer 10 (350 nm or 7.35% of the wavelength λ). Another measurement was taken setting the thickness t2 of the IDT electrode 64 to be 40% of the thickness t1 of the piezoelectric layer 10 (400 nm or 8.4% of the wavelength λ). Another measurement was taken setting the thickness t2 of the IDT electrode 64 to be 45% of the thickness t1 of the piezoelectric layer 10 (450 nm or 9.45% of the wavelength λ).

The measurement results indicate that the SAW resonator 4 with thicker IDT electrode 64, when the thickness t2 is 40% and 45% of the thickness t1 of the piezoelectric layer 10, the response is improved as compared to the SAW resonator 4 when the thickness t2 is 35% of the thickness t1 of the piezoelectric layer 10. Therefore, the SAW resonator 4 with the thickness t2 of more than 40% of the thickness t1 can reduce, minimize or remove the unwanted response 2 (see FIG. 4) that would be present in the frequency of interest at around 850 MHz. The improvements observed from the measurement results can be due to at least, for example, the increased total weight of the IDT electrode structure by having the thickness t2 more than 40% of the thickness t1.

In various embodiments disclosed herein, a SAW resonator frequency response can be improved using a tilted IDT electrode structure with pitch modulation and an IDT electrode thickness t2 of at least 40% of the thickness t1 of the piezoelectric layer 10 (400 nm or 8.4% of the wavelength λ). Any suitable principles and advantages disclosed herein can be used with an IDT electrode that has both a non-zero rotation angle and a non-zero tilt angle. Though some of the embodiments disclosed herein are described using one type of resonator (e.g., a multilayer piezoelectric substrate SAW resonator), any suitable principles and advantages disclosed herein can be used with any types of resonators such as a temperature compensated (TC) SAW resonator.

Figure 8:
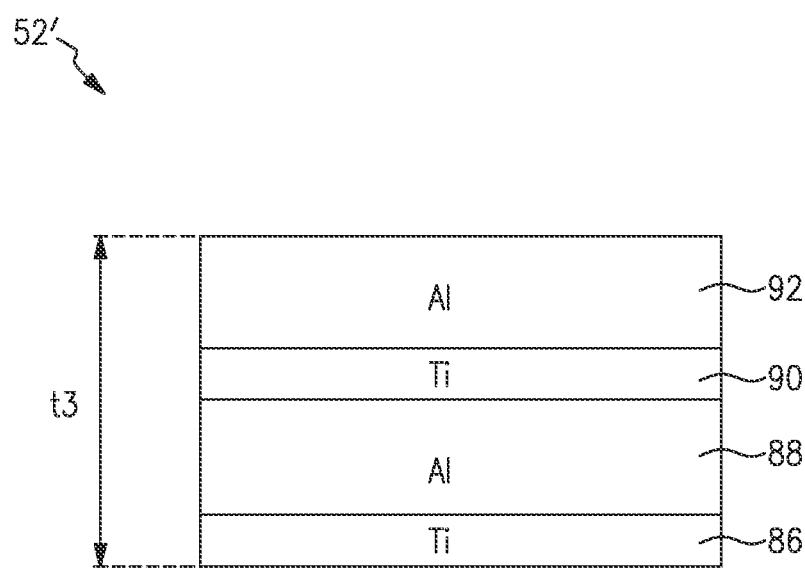
FIG. 8 is a schematic cross sectional side view of a portion of an IDT electrode according to an embodiment.

FIG. 8 is a schematic cross sectional side view of a portion of an IDT electrode 52' according to an embodiment. The IDT electrode 52' has a multilayer IDT electrode structure in which two or more layers of metal define the IDT electrode 52'. In the illustrated IDT electrode 52', there are a first titanium layer 86, a second aluminum layer 88 over the first titanium layer 86, a third titanium layer 90 over the second aluminum layer 88, and a fourth aluminum layer 92 over the third titanium layer 90. The IDT electrode 52' has a thickness t3.

In some embodiments, the IDT electrode 52 of the SAW resonator 4 can be replaced with the IDT electrode 52'. When the IDT electrode 52' is used with the SAW resonator 4, the thickness t3 of the IDT electrode 52' can be the same as or generally similar to the thickness t2 of the IDT electrode 52 described above.

In various embodiments disclosed herein, an IDT electrode can include any other suitable IDT electrode material(s). For example, an IDT electrode can include one or more of an aluminum (Al) layer, a molybdenum (Mo) layer, a tungsten (W) layer, a titanium (Ti) layer, a platinum (Pt) layer, a gold (Au) layer, a silver (Ag) layer, a copper (Cu) layer, a Magnesium (Mg) layer, a ruthenium (Ru) layer, or the like. The IDT electrode may include alloys, such as AlMgCu, AlCu, etc. In some embodiments, the IDT electrode can be a multi-layer IDT electrode. As an example, a multi-layer IDT electrode can include an Al layer over a Mo layer or an Al layer over a W layer.

FIGS. 9A to 9C are graphs showing frequency response measurement results of SAW resonators that are similar to the SAW resonator 4 illustrated in FIGS. 6A and 6B. Different IDT electrode materials are used in these measurements. In FIG. 9A, an aluminum layer IDT electrode with its thickness of 350 nm was used. In FIG. 9B, an aluminum layer IDT electrode with its thickness of 400 nm was used. In FIG. 9C, a multilayer IDT electrode including a molybdenum layer with its thickness of 150 nm and an aluminum layer with its thickness of 200 nm was used. The measurement results indicate that the slanted stopband (response 2) can be reduced, minimized or removed by using these IDT electrode structures.

Acoustic wave resonators disclosed herein can be included in a filter arranged to filter a radio frequency signal. One or more acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW resonators disclosed herein. FR1 can be from 410 megahertz (MHz) to 7.125 gigahertz (GHz), for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band.

Figure 10:
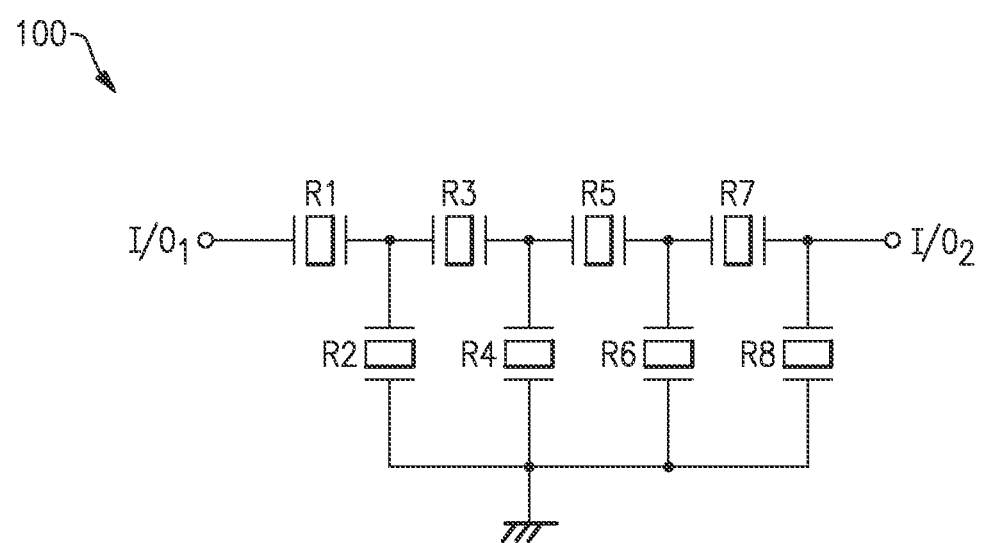
FIG. 10 is a schematic diagram of a ladder filter that includes an acoustic wave resonator according to an embodiment.

FIG. 10 is a schematic diagram of a ladder filter 100 that includes an acoustic wave resonator according to an embodiment. The ladder filter 100 is an example topology that can implement a band pass filter formed from acoustic wave resonators. In a band pass filter with a ladder filter topology, the shunt resonators can have lower resonant frequencies than the series resonators. The ladder filter 100 can be arranged to filter a radio frequency signal. As illustrated, the ladder filter 100 includes series acoustic wave resonators R1, R3, R5, and R7 and shunt acoustic wave resonators R2, R4, R6, and R8 coupled between a first input/output port I/O$_1$ and a second input/output port I/O$_2$. Any suitable number of series acoustic wave resonators can be in included in a ladder filter. Any suitable number of shunt acoustic wave resonators can be included in a ladder filter. The first input/output port I/O$_1$ can a transmit port and the second input/output port I/O$_2$ can be an antenna port. Alternatively, first input/output port I/O$_1$ can be a receive port and the second input/output port I/O$_2$ can be an antenna port.

Figure 11:
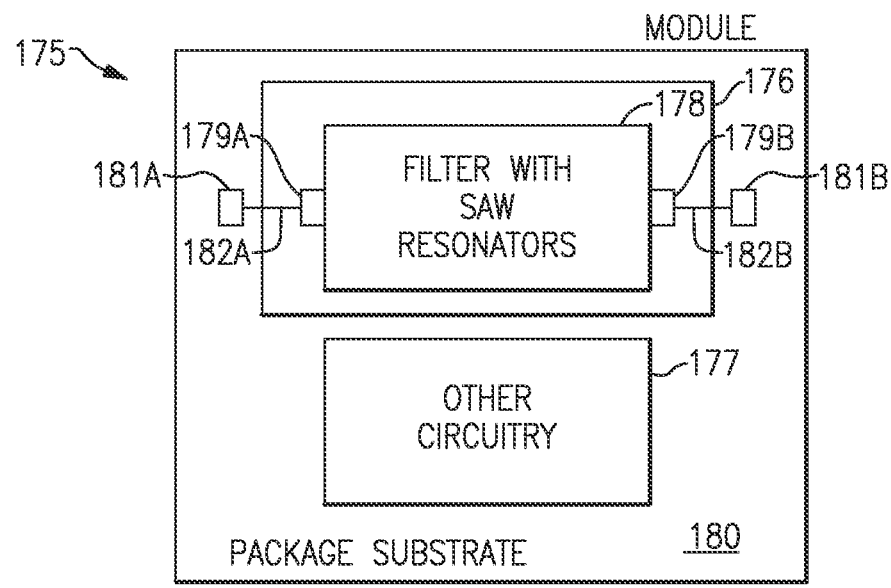
FIG. 11 is a schematic diagram of a radio frequency module that includes a surface acoustic wave resonator according to an embodiment.

FIG. 11 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 11 includes a filter 178 and terminals 179A and 179B. The filter 178 includes SAW resonators. One or more of the SAW resonators can be implemented in accordance with any suitable principles and advantages of the surface acoustic wave resonator 4 of FIGS. 6A and 6B and/or any surface acoustic wave resonators disclosed herein. The filter 178 can be a TCSAW filter arranged as a band pass filter to filter radio frequency signals with frequencies below about 3.5 GHz in certain applications. The terminals 179A and 178B can serve, for example, as an input contact and an output contact. The SAW component 176 and the other circuitry 177 are on a common packaging substrate 180 in FIG. 11. The packaging substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 12:
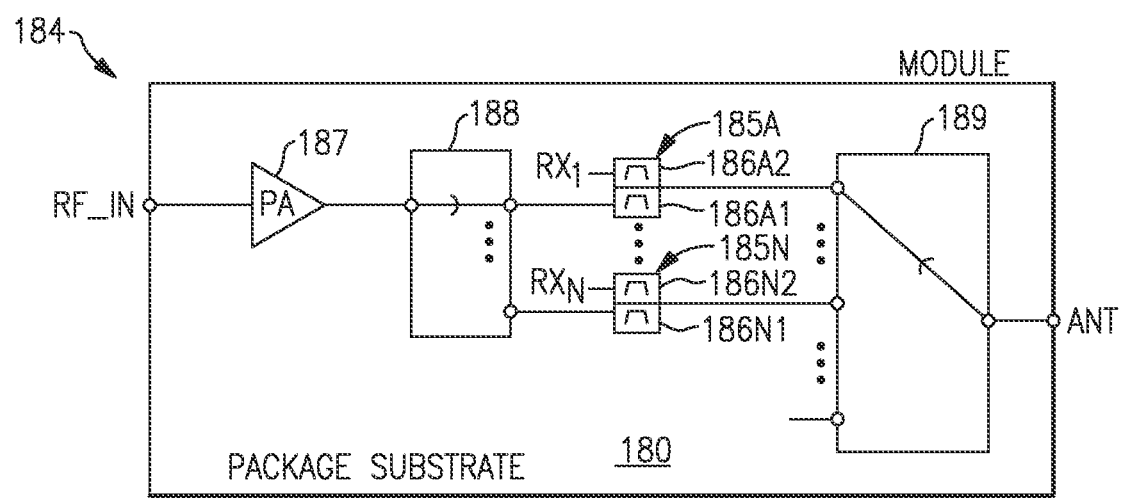
FIG. 12 is a schematic diagram of a radio frequency module that includes filters with surface acoustic wave resonators according to an embodiment.

FIG. 12 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein. Although FIG. 12 illustrates duplexers, any suitable principles and advantages disclosed herein can be implemented in other multiplexers (e.g., quadplexers, hexaplexers, octoplexers, etc.) and/or in switch-plexers.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 13:
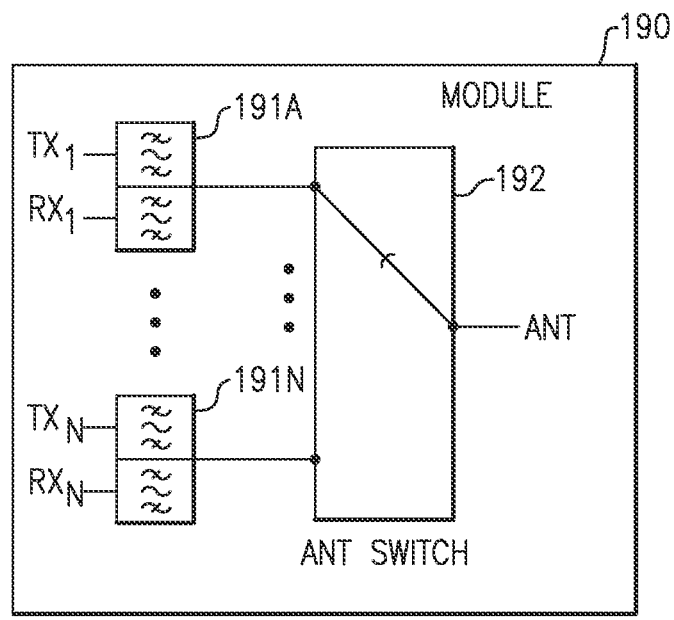
FIG. 13 is a schematic block diagram of a module that includes an antenna switch and duplexers that include a surface acoustic wave resonator according to an embodiment.

FIG. 13 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 14A:
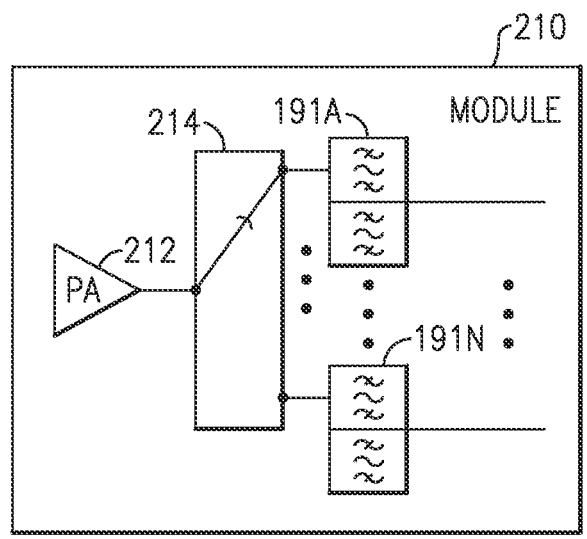
FIG. 14A is a schematic block diagram of a module that includes a power amplifier, a radio frequency switch, and duplexers that include a surface acoustic wave resonator according to an embodiment.

FIG. 14A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 14B:
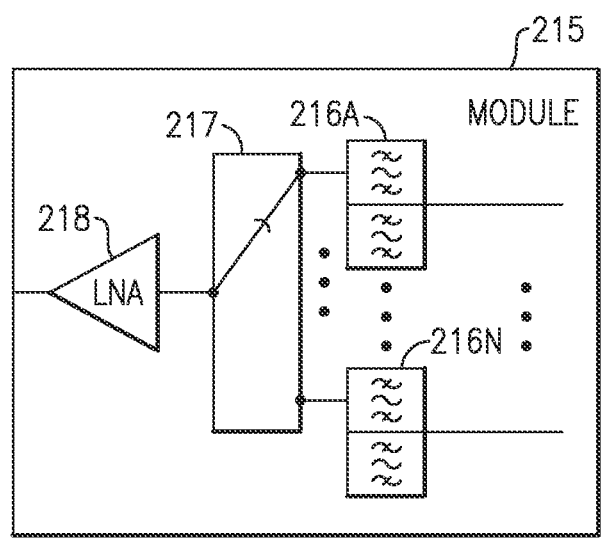
FIG. 14B is a schematic block diagram of a module that includes filters, a radio frequency switch, and a low noise amplifier according to an embodiment.

FIG. 14B is a schematic block diagram of a module 215 that includes filters 216A to 216N, a radio frequency switch 217, and a low noise amplifier 218 according to an embodiment. One or more filters of the filters 216A to 216N can include any suitable number of acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 15A:
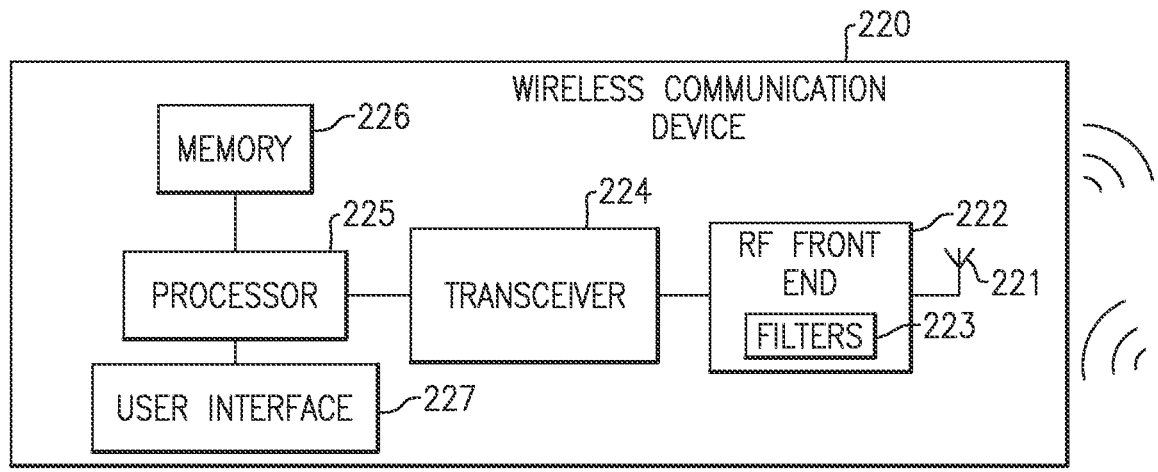
FIG. 15A is a schematic block diagram of a wireless communication device that includes a filter with a surface acoustic wave resonator in accordance with one or more embodiments.

FIG. 15A is a schematic diagram of a wireless communication device 220 that includes filters 223 in a radio frequency front end 222 according to an embodiment. The filters 223 can include one or more SAW resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW resonators of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 15B:
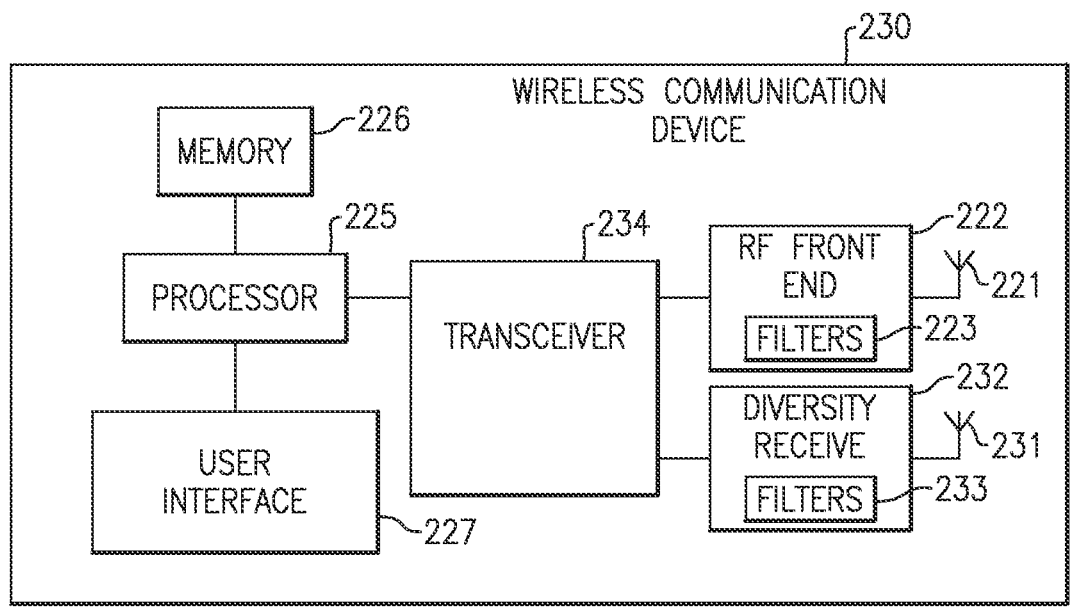
FIG. 15B is a schematic block diagram of another wireless communication device that includes a filter with a surface acoustic wave resonator in accordance with one or more embodiments.

FIG. 15B is a schematic diagram of a wireless communication device 230 that includes filters 223 in a radio frequency front end 222 and a second filter 233 in a diversity receive module 232. The wireless communication device 230 is like the wireless communication device 200 of FIG. 15A, except that the wireless communication device 230 also includes diversity receive features. As illustrated in FIG. 15B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators and/or acoustic wave devices that include an IDT electrode, such as Lamb wave resonators and/or boundary wave resonators. For example, any suitable combination of features of the tilted and rotated IDT electrodes disclosed herein can be applied to a Lamb wave resonator (for example, a Lamb wave resonator) and/or to a boundary wave device (for example, a boundary wave resonator).

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 GHz, such as in a frequency range from about 410 MHz to 8.5 GHz.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. All numerical values, such as values for rotation angle and tilt angle, in this application and the claims are intended to encompass similar values within error of available measurement techniques. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a piezoelectric layer having four sides, with first and second sides that extend in parallel with each other, and third and fourth sides perpendicular to the first and second sides, the third and fourth sides extending in parallel with each other;
an interdigital transducer electrode over the piezoelectric layer, the interdigital transducer electrode having at least four layers of alternating titanium and aluminum layers with a non-zero tilt angle and a non-zero rotation angle, the interdigital transducer electrode configured to shift a stopband of the acoustic wave device and to reduce a slanted stopband, the interdigital transducer electrode including first and second bus bars that are in parallel with the first and second sides of the piezoelectric layer, at least a first set of fingers electrically connected to a first bus bar and a at least a second set of fingers electrically connected to a second bus bar, the interdigital transducer electrode further including a first region where the first and second sets of fingers do not extend between each other, and a second region where the first and second sets of fingers do extend between each other, the first and second sets of fingers in the second region extending non-parallel with any of the four sides of the piezoelectric layer.

2. The acoustic wave device of claim 1 wherein a total weight of the interdigital transducer electrode is selected so as to reduce the slanted stopband of the acoustic wave device.

3. The acoustic wave device of claim 1 wherein the interdigital transducer electrode includes dummy fingers and non-dummy fingers.

4. The acoustic wave device of claim 3 wherein further comprising a pair of reflectors over the piezoelectric layer, the interdigital transducer electrode positioned longitudinally between the pair of reflectors.

5. The acoustic wave device of claim 4 wherein the non-zero tilt angle and the non-zero rotation angle of the interdigital transducer electrode with the pair of reflectors reduce an area on the piezoelectric layer needed for the interdigital transducer electrode.

6. The acoustic wave device of claim 1 wherein a thickness of the interdigital transducer electrode is at least 40% of a thickness of the piezoelectric layer.

7. The acoustic wave device of claim 1 wherein a thickness of the interdigital transducer electrode is at least 400 nm.

8. The acoustic wave device of claim 1 wherein the acoustic wave device is configured to generate a surface acoustic wave having a wavelength $\lambda$, a thickness of the interdigital transducer electrode is at least $0.08\lambda$.

9. The acoustic wave device of claim 8 wherein the thickness of the interdigital transducer electrode is at least $0.09\lambda$.

10. The acoustic wave device of claim 1 wherein the non-zero tilt angle is between 5° to 15°.

11. The acoustic wave device of claim 1 further comprising a first reflector and a second reflector positioned such that the interdigital transducer electrode is disposed between the first reflector and the second reflector.

12. The acoustic wave device of claim 11 wherein the interdigital transducer electrode has a pitch that is wider than a pitch of the first reflector so as to shift stopband of the acoustic wave device to a higher frequency as compared to when the pitch of the interdigital transducer electrode is equal to the pitch of the first reflector.

13. The acoustic wave device of claim 1 wherein the piezoelectric layer is a lithium tantalate layer.

14. The acoustic wave device of claim 1 further comprising a support substrate positioned under the piezoelectric layer.

15. The acoustic wave device of claim 14 further comprising an intermediate layer between the piezoelectric layer and the support substrate, the support substrate includes silicon and the intermediate layer includes silicon dioxide.

16. An acoustic wave device comprising:
a piezoelectric layer having four sides, with first and second sides that extend in parallel with each other, and third and fourth sides perpendicular to the first and second sides, the third and fourth sides extending in parallel with each other;
a first reflector and a second reflector on the piezoelectric layer;
an interdigital transducer electrode over the piezoelectric layer and positioned between the first reflector and the second reflector, the interdigital transducer electrode having at least four layers of alternating titanium and aluminum layers with a tilt angle being between 5° to 15°, a non-zero rotation angle, and a pitch of the interdigital transducer electrode being different from a pitch of the first reflector to shift a stopband of the acoustic wave device, a thickness of the interdigital transducer electrode configured to reduce a slanted stopband, the interdigital transducer electrode including at least first and second bus bars that are in parallel with the first and second sides of the piezoelectric layer, a first set of fingers electrically connected to the first bus bar and at least a second set of fingers electrically connected to a second bus bar, the interdigital transducer electrode further including a first region where the first and second sets of fingers do not extend between each other, and a second region where the first and second sets of fingers do extend between each other, the first and second sets of fingers in the second region extending non-parallel with any of the four sides of the piezoelectric layer.

17. The acoustic wave device of claim 16 wherein the pitch of the interdigital transducer electrode is wider than the pitch of the first reflector.

18. The acoustic wave device of claim 16 wherein the interdigital transducer electrode includes dummy fingers and non-dummy fingers.

19. The acoustic wave device of claim 16 wherein the acoustic wave device is configured to generate a surface acoustic wave having a wavelength $\lambda$, a thickness of the interdigital transducer electrode is at least $0.08\lambda$.

20. The acoustic wave device of claim 16 wherein the piezoelectric layer is a lithium tantalate layer.

* * * * *